US008330233B2

(12) United States Patent
     Omori

(10) Patent No.: US 8,330,233 B2
(45) Date of Patent: Dec. 11, 2012

(54) SEMICONDUCTOR DEVICE

(75) Inventor: Tomoyuki Omori, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 197 days.

(21) Appl. No.: 12/836,911

(22) Filed: Jul. 15, 2010

(65) Prior Publication Data

US 2011/0018101 A1    Jan. 27, 2011

(30) Foreign Application Priority Data

Jul. 24, 2009 (JP) ................................ 2009-173268

(51) Int. Cl.
    *H01L 29/78* (2006.01)
(52) U.S. Cl. .. 257/409; 257/492; 257/548; 257/E29.012
(58) Field of Classification Search ................. 257/409, 257/491, 492, 548, E29.012, E29.019
    See application file for complete search history.

(56) References Cited

U.S. PATENT DOCUMENTS

| 7,161,209 | B2 | 1/2007 | Saito et al. | |
| 7,317,225 | B2 | 1/2008 | Saito et al. | |
| 7,345,342 | B2 * | 3/2008 | Challa et al. | 257/341 |
| 2005/0167742 | A1 * | 8/2005 | Challa et al. | 257/328 |

FOREIGN PATENT DOCUMENTS

| JP | 2001-298190 | 10/2001 |
| JP | 2003-273355 | 9/2003 |
| JP | 2006-5275 | 1/2006 |
| JP | 2006-73740 | 3/2006 |
| JP | 2007-529115 | 10/2007 |

OTHER PUBLICATIONS

Japanese Office Action issued Jun. 14, 2011, in Patent Application No. 2009-173268 (with English-language translation).

* cited by examiner

*Primary Examiner* — Tuan N. Quach
(74) *Attorney, Agent, or Firm* — Oblon, Spivak, McClelland, Maier & Neustadt, L.L.P.

(57) ABSTRACT

A semiconductor device 1 including a cell region 2 formed with a semiconductor element 6 and a periphery region 3 formed in the periphery of the cell region 2. The semiconductor region 1 is arranged with an n⁻ type drift region 12 formed in the cell region 2 and periphery region 3, a plurality of p⁻ type columnar regions formed in the n⁻ drift region 12 of the cell region 2, a plurality of p⁻ type columnar resistance improvement regions 23n formed in the n⁻ type drift region 12 of the periphery region 3, and a plurality of electrical field buffer regions 24n formed in an upper part of the p⁻ type columnar region 23n. An interval Sn between the electrical field buffer region 24n and an adjacent electrical field buffer region 24n is different between an interior side and an exterior side of the periphery region 3.

8 Claims, 7 Drawing Sheets

SEMICONDUCTOR DEVICE

CROSS REFERENCE TO RELATED APPLICATION

This application is based upon and claims the benefit of priority from the prior Japanese Patent Application No. 2009-173268 filed on Jul. 24, 2009, the entire contents of which is incorporated herein by reference.

BACKGROUND OF THE INVENTION

1. Field of the Invention

The present invention is related to a semiconductor device and in particular, a semiconductor device having a super junction which includes a columnar region which extends in the thickness direction of a substrate.

2. Description of the Related Art

A semiconductor device having a super junction structure is conventionally known. In patent document 1 (Japan Laid Open Patent 2006-5275), a semiconductor device is disclosed having a super junction structure arranged with a cell region formed with a plurality of semiconductor elements and a periphery region for resistance improvement. In a cell region of this semiconductor device, a plurality of first p type columnar regions and a plurality of first n type columnar regions are alternately formed. In the periphery region, a plurality of second p type columnar regions and a plurality of second n type columnar regions are alternately formed. Furthermore, in the periphery region, a third p type columnar region and an n type high resistance layer are formed on an upper layer of the above stated second p type columnar regions and the second n type columnar regions.

Here, the depth of the first p type and the first n type columnar region is deeper than the depth of the second p type and second n type columnar region. In addition, the width of the second p type columnar region is different to the width of the third columnar region.

In the semiconductor device described in patent document 1, it is possible to reduce the variation in the amount of impurities in each columnar region by using a third p type columnar region. In this way, it is possible to make the ratio (charge ratio) between a charge of a p type columnar region and a charge of an n type columnar region constant, and it is possible to improve the resistance of the semiconductor device.

However, in the technology disclosed in patent document 1, there is the problem that the manufacturing process becomes complex because the depth and width of columnar regions are different. In particular, when the depth of columnar regions is different, it is difficult to make the amount of purities in each columnar region equal and it is very difficult to adjust the amount of implanted ions.

SUMMARY OF THE INVENTION

The present invention was invented to solve the above described problems and provides a semiconductor device have a simple structure and simplified manufacturing process which can improve resistance.

In order to solve the above described problems, in a semiconductor device related to a feature of an embodiment of the present invention includes a cell region formed with semiconductor elements, a periphery region formed on a periphery of the cell region, a first conduction type first conduction type region formed in the cell region and the periphery region, a plurality of second conduction type first columnar regions formed in the first conduction type region of the cell region, a plurality of second conduction type second columnar regions formed in the first conduction type region of the periphery region, and a plurality of second conduction type electrical field buffer regions formed on an upper part of the second columnar region, wherein an interval between the electrical field buffer region and an adjacent electrical field buffer region is different between an interior side and an exterior side.

In addition, in the semiconductor device related to a feature of the embodiment it is preferable that an interval between the electrical field buffer region and the adjacent electrical field buffer region on the interior side of the periphery region is smaller than an interval between the electrical field buffer region and an the adjacent electrical field buffer region on the exterior side of the cell region.

In addition, in the semiconductor device related to a feature of the embodiment it is preferable that an interval between the electrical field buffer region and the adjacent electrical field buffer region becomes gradually smaller from an interior side of the periphery.

In addition, in the semiconductor device related to a feature of the embodiment it is preferable that a width of the electrical buffer region becomes gradually smaller from an interior side of the periphery region approaching an exterior side.

In addition, in the semiconductor device related to a feature of the embodiment it is preferable that a depth of the electrical buffer region becomes gradually shallower approaching an exterior side of the periphery region.

Furthermore, in the semiconductor device related to a feature of the embodiment it is preferable that a distance between the first columnar region and the adjacent first columnar region and a distance between the second columnar region and the adjacent second columnar region is equal.

In the semiconductor device related to a feature of an embodiment of the present invention, by making the width between an interior side electrical field buffer region and a width of an exterior side electrical field buffer region different, it is possible to accelerate a widening of an exterior side depletion layer and buffer an electrical field. In this way, it is possible to improve resistance of the semiconductor device. As a result, in the semiconductor device, it is possible to make the shape of the first columnar region and the second columnar region the same and because it is possible to easily adjust the amount of impurities in the first columnar reign and the second columnar region it is possible to simplify the manufacturing process.

DETAILED DESCRIPTION OF THE INVENTION

Figure 1:
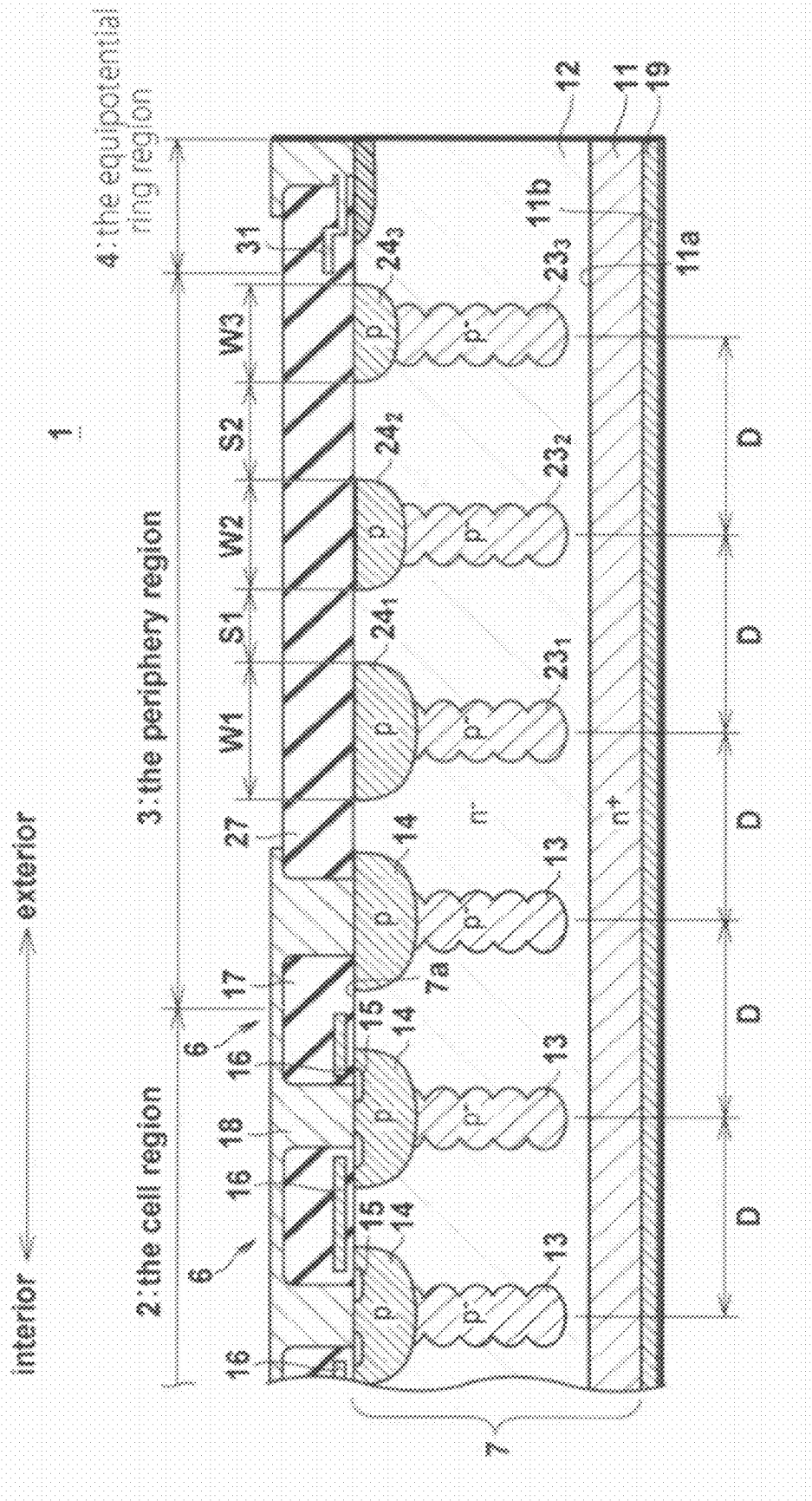
FIG. 1 is a cross sectional diagram of a semiconductor device related to an embodiment of the present invention.
Figure 2:
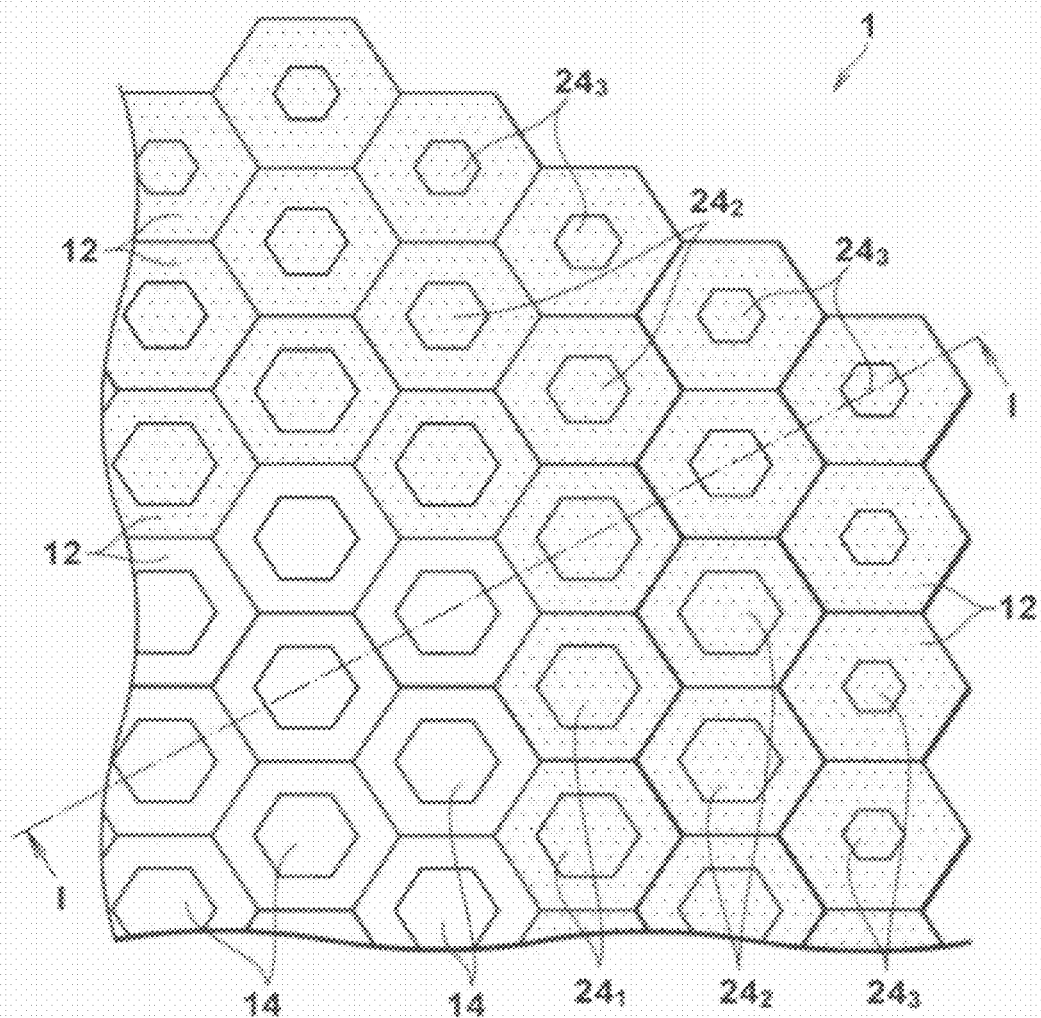
FIG. 2 is a planar abbreviated diagram of the semiconductor device shown in FIG. 1.

A embodiment in which the present invention is applied to a semiconductor device having a plurality of FET (field effect transistor) is explained below while referring to the diagrams. Here, FIG. 1 is a cross sectional diagram of a semiconductor device related to the present embodiment. FIG. 2 is a planar abbreviated diagram of the semiconductor device. Furthermore, the cross sectional diagram shown in FIG. 1 is a cross sectional view along the line I-I shown in FIG. 2. In the explanation below, [exterior] and [interior] indicated by arrows in FIG. 1, indicate the [exterior side] and [interior side] of the semiconductor device. The planar abbreviated diagram shown in FIG. 2 is a diagram in which the characteristic structure has been extracted and depicted in order to easily explain the flat shape of a p type base region and an electric filed buffer region. Unrelated structure is omitted from this explanation.

[Structure of the Semiconductor Device]

As is shown in FIG. 1 and FIG. 2, the semiconductor 1 related to an embodiment includes a cell region 2, a periphery region 3 and an equipotential ring region 4.

The cell region 2 is formed with a plurality of semiconductor elements (FET: field effect transistor) having a super junction structure.

As is shown in FIG. 1 and FIG. 2, the cell region 2 is arranged with a substrate 11, an $n^-$ type drift region (equivalent to a first conduction type region described in the claims) 12, a plurality of $p^-$ type columnar regions (equivalent to a first columnar region described in the claims) 13, a p type base region 14, an n type source region 15, a gate electrode 16, a gate insulation film 17, a source electrode 18 and a drain electrode 19. Furthermore, in the explanation below, the substrate 11, the $n^-$ type drift region 12, the $p^-$ type columnar region 13, the p type base region 14 and the n type source region 15 form a semiconductor substrate (a semiconductor base substance) 7.

The substrate 11 is comprised from an n type semiconductor in which a silicon (Si) semiconductor is doped with n type impurities such as phosphorous (P). The substrate 11 functions as a drain electrode.

The n type drift region 12 is formed on one main surface 11a of the substrate 11. The n type drift region 12 has a lower concentration of impurities than the substrate 11.

The $p^-$ type columnar region 13 is comprised from a $p^-$ type semiconductor in which a silicon (Si) semiconductor is doped with p type impurities such as boron (B). The $p^-$ type columnar region 13 is formed within the $n^-$ type drift region 12. The $p^-$ type columnar region 13 is formed so to extend in an up down direction in the diagram, that is, in the thickness direction of the substrate 11. As is shown in FIG. 2, the $p^-$ type columnar region 13 is formed in a dot shape seen from a planar view.

One $p^-$ type columnar region 13 and another adjacent $p^-$ type columnar region 13 are arranged so that the distance (pitch) D between them becomes equal. Furthermore, the meaning of distance used here is the distance between the centers of adjacent $p^-$ type columnar regions 13. Each $p^-$ type columnar region 13 is arranged so that their depth, concentration of impurities and width (plane area) all become equal.

The p type base region 14 is comprised from a p type semiconductor. The concentration of impurities in the p type base region 14 is higher than the concentration of impurities in the $p^-$ type columnar region 13. The p type base region 14 is formed on an upper part of the $p^-$ type columnar region 13. The upper surface of the p type base region is exposed on one main surface 7a of the semiconductor substrate 7. The p type base region 14 is formed in a dot shape seen from a planar view as is shown in FIG. 2. One p type base region 14 and another adjacent p type base region 14 are arranged so that the distance (pitch) D between them becomes equal. Each p type base region 14 is arranged so that their depth, concentration of impurities and width (plane area) all become equal.

The n type source region 15 is formed in an island shape on the interior side of each p type base region 14. The n type source region 15 is exposed on one main surface 7a of the semiconductor substrate 7.

The gate electrode 16 is comprised from poly-crystal silicon. The gate electrode 16 is formed in a web shape seen from a planar view. An end part of the gate electrode 16 is connected to a gate terminal (omitted from the diagram).

The gate insulation film 17 is formed between the semiconductor substrate 7 and the gate electrode 16, and electrically insulates this semiconductor substrate 7 and the gate electrode 16. The gate insulation film 17 is comprised from a silicon oxide film.

The source electrode 18 injects electrons into the n type source region 15. The source electrode 18 is electrically connected to the p type source region 14 and the n type source region 15 via an ohmic contact.

The drain electrode 19 is electrically connected to the other main surface 11b of the substrate 11 via an ohmic contact.

The periphery region 3 is formed to enclose the periphery of the cell region 2. This periphery region 3 includes a function for improving withstanding voltage. As is shown in FIG. 1 and FIG. 2, the periphery region 3 is arranged with the substrate 11, the $n^-$ type drift region 12, a plurality of $p^-$ type columnar withstanding voltage improvement regions $23n$ (n=1, 2, . . . ), a p type electric field buffer region $24n$ (n=1, 2, . . . ) and an insulation film 27. The $p^-$ type columnar withstanding voltage improvement regions $23n$ are equivalent to a second columnar region described in the claims. Furthermore, in the structure of the periphery region 3, the same reference symbols are attached to the same structure of the cell region 2 and overlapping explanations are omitted.

The $p^-$ type columnar withstanding voltage improvement region (below referred to simply as [$p^-$ type columnar region]) $23n$ of the periphery region 3 includes the same structure as the $p^-$ type columnar region 13 of the cell region 2. That is, one $p^-$ type columnar region $23n$ and another adjacent $p^-$ type columnar region $23n_{+1}$ are arranged so that the distance D between them becomes equal. Each $p^-$ type columnar region $23n$ is formed so that their depth, concentration of impurities and width (plane area) all become equal with the $p^-$ type columnar region 13.

With this type of structure, the ratio (below referred to simply as [charge ratio]) between the charge of the $n^-$ type drift region 12 in the periphery region 3 and the charge of the $p^-$ type columnar region $23n$ becomes equal to the charge ration between the $n^-$ type drift region 12 in the cell region 2 and the charge of the $p^-$ type columnar region 13.

A p type electrical field buffer region $24n$ is comprised of a p type semiconductor. The concentration of impurities in the p type electrical field buffer region $24n$ is roughly equal to the concentration of impurities in the p type base region 14. The p type electrical field buffer region 24n is formed on an upper part of the p⁻ type columnar region 23n. The upper surface of the p type electrical field buffer region 24n is exposed on one main surface 7a of the semiconductor substrate 7. The p type electrical field buffer region 24n is formed in a dot shape seen from a planar view as is shown in FIG. 2.

One p type electrical field buffer region 24n and another adjacent p type electrical field buffer region $24n_{+1}$ are arranged so that the distance D between them becomes equal. Furthermore, here, distance D means the distance between the centers of the adjacent p type electrical field buffer regions 24n seed from a planar view.

As is shown in FIG. 1, the width Wn (n=1, 2, ...) of the p type electrical field buffer region 24n becomes gradually smaller from the interior side of the periphery region 3 approaching the exterior side. That is, the width Wn can be expressed as in the following formula (1).

$$W1 > W2 > W3 \tag{1}$$

Furthermore, here, width Wn means the dimensions in a direction heading towards the exterior side from the interior side. As an example, it is possible to set the width Wn to become smaller every 10% so that [distance D1×0.9=distance D2], [distance D2×0.9=distance D3]. In this way, an interval Sn between one p type electrical field buffer region 24n and another adjacent p type electrical field buffer region $24n_{+1}$ becomes gradually larger approaching the exterior side. That is, it is possible to express the interval Sn as in the following formula (2).

$$S1 < S2 \tag{2}$$

The depth of the p type electrical field buffer region 24n becomes gradually shallower from the interior side approaching the exterior side. The concentration of impurities in each p type electrical field buffer region 24n is roughly equal.

The insulation film 27 is comprised form silicon oxide. The insulation film 27 is formed so as to cover the main surface 7a of the semiconductor substrate 7 in the periphery region 3.

The equipotential ring region 4 is formed so as to enclose the periphery of the periphery region 3. As is shown in FIG. 1, the equipotential ring region 4 includes a ring electrode 31 which encloses the periphery region 3. The ring electrode 31 is connected to the drift region 12. In this way, the equipotential ring region 4 includes a function for controlling the extension of a depletion layer to the side surface of the semiconductor substrate 7, and also includes a function for stabilizing a change of the surface of the insulation film 27.

[Operation of the Semiconductor Device]

The operation of the semiconductor device by the present embodiment stated above is as follows. First, the operation of a semiconductor element 6, which is a FET, when in an ON state is as follows.

A voltage is applied between the drain electrode 19 and the source electrode 18 so that the potential of the drain electrode 19 becomes higher the potential of the source electrode 18. In this state, when a voltage the same or higher than a threshold value is applied to the gate electrode 16, carriers (electrons) are accumulated in the p type base region 14 of a region which faces the gate electrode 16. In this way, a channel is formed in this region on the upper surface apart of the p type base region 14. As a result, the carriers (electrons) injected from the source electrode 18 flow through the n type base region 15, the channel of the p type base region 14, the n⁻ type drift region 12 and the substrate 11 and arrive at the drain electrode 19. Furthermore, a current flows from the drain electrode 19 to the source electrode 18.

Next, the operation of the semiconductor element 6, which is a FET, when in an OFF state, is as follows.

In an OFF state, the depletion layer widens between p⁻ type columnar regions 23n as well as between p type columnar regions 13 of the cell region 2. In this way, an electrical field concentration in the periphery of the cell region 2 is reduced. Furthermore, in the periphery region 3, the width Wn of the electrical buffer region 24n becomes gradually smaller from the interior side approaching the exterior side. As a result, the depletion layer widens as far as the exterior side of the outermost p⁻ type columnar region $23_3$ in the exterior region 3, and the thickness of the depletion layer becomes smoothly and gradually smaller approaching the exterior side of the periphery region 3. In this way, the electrical field is also buffered in the exterior region of the periphery region 3, and an electrical field concentration is reduced. As a result, because it is possible to reduce a leak current in the exterior side of the periphery region 3 it is possible to improve the resistance of the semiconductor device 1.

[Manufacturing Method of the Semiconductor Device]

The manufacturing method of the semiconductor device 1 related to the present embodiment stated above is as follows. FIG. 3 to FIG. 8 are process cross sectional diagrams shown in each manufacturing process of the semiconductor device related to the present invention.

Figure 3:
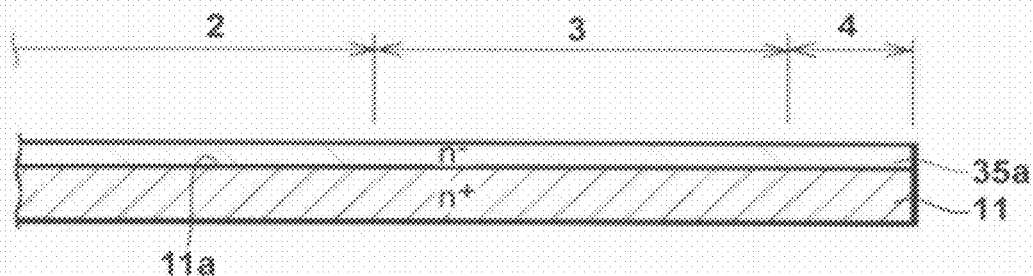
FIG. 3 is a first process cross sectional diagram for explaining a manufacturing process of the semiconductor device shown in FIG. 1.

First, as is shown in FIG. 3, a first layer n⁻ type drift region layer 35a is formed on a main surface 11a of the substrate 11 using an epitaxial growth method.

Figure 4:
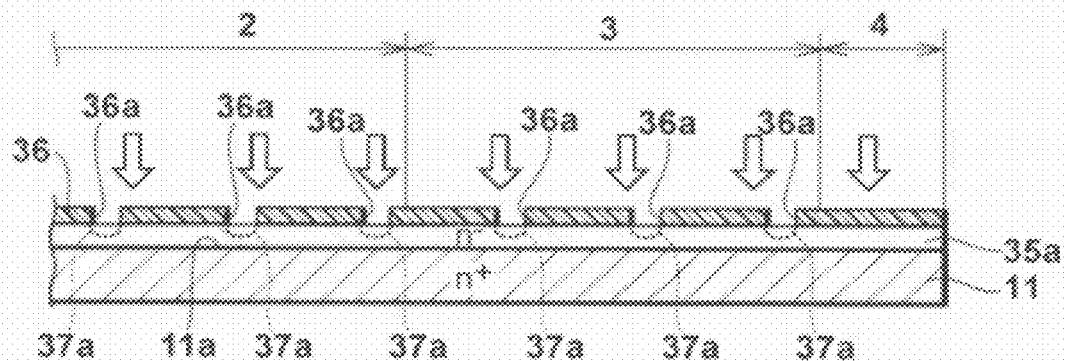
FIG. 4 is a second process cross sectional diagram.

Next, as is shown in FIG. 4, a resist film 36 formed with an aperture part 36a including a desired pattern is formed on an upper surface of the n-type drift region layer 35a. Here, the aperture part 36a of the resist film 36 is arranged corresponding to a region in which the p type columnar regions 13 and 23n are formed. All of the aperture parts 36a are formed with the same shape. In addition, one aperture part 36a and an adjacent aperture part 36a are formed so that the distance (pitch) between them is equal. Using this resist film 36, p type impurities are implanted into the n⁻ type drift region layer 35a via the aperture part 36a using an ion implantation method, and a p type impurity region 37a is formed in the n⁻ type drift region layer 35a. Here, the amount of ions implantation is uniformly set above the surface of the n⁻ type drift region layer 35a. In this way, the amount of p type impurities implanted for forming the p type impurity region 37a is uniform. Following this, the resist pattern 36 is removed.

Figure 5:
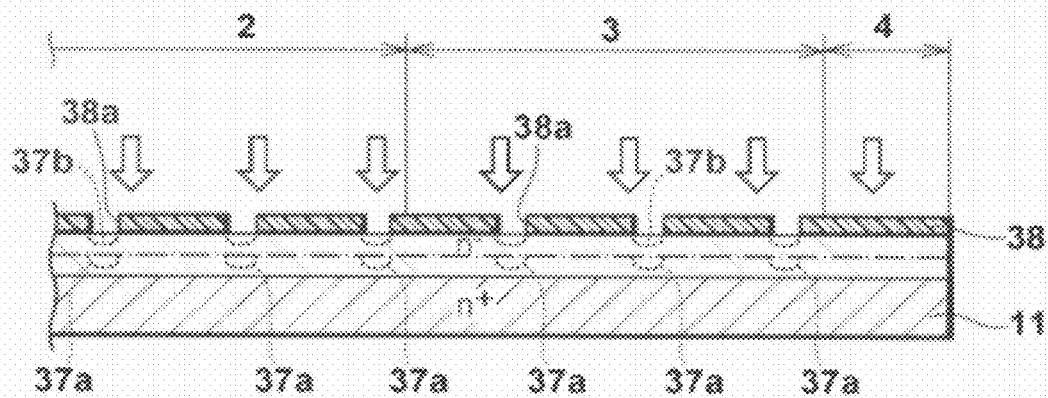
FIG. 5 is a third process cross sectional diagram.

Next, as is shown in FIG. 5, a second layer n⁻ type drift region layer 35b is formed on upper surface of the first layer n⁻ type drift region layer 35a using an epitaxial growth method. Following this, a resist film 38 formed with an aperture part 38a including a desired pattern is formed in the upper surface of the n⁻ type drift region layer 35b. Using this resist film 38, p type impurities are implanted into the n⁻ type drift region layer 35b via the aperture part 38a using an ion implantation method, and a p type impurity region 37b is formed. Following this, the resist film 38 is removed.

Figure 6:
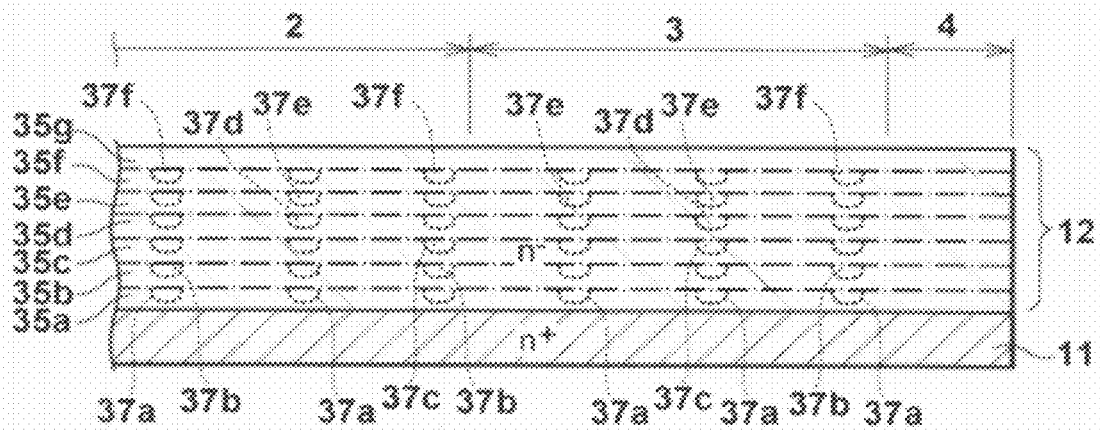
FIG. 6 is a fourth process cross sectional diagram.

Following this, as is shown in FIG. 6, the same process is performed a desired number of times, for example, is repeated four times. In this way, p type impurity region 37c to p type impurity regions 37f and n⁻ type drift region layer 35c to n⁻ type drift region layer 35f are formed in the same way. Lastly, the uppermost layer n⁻ type drift region layer 35g is formed using an epitaxial growth method. Furthermore, a p type impurity region is not formed on this n⁻ type drift region layer 35g. When the uppermost layer n⁻ type drift region layer 35g is formed the n⁻ type drift region 12 is complete.

Figure 7:
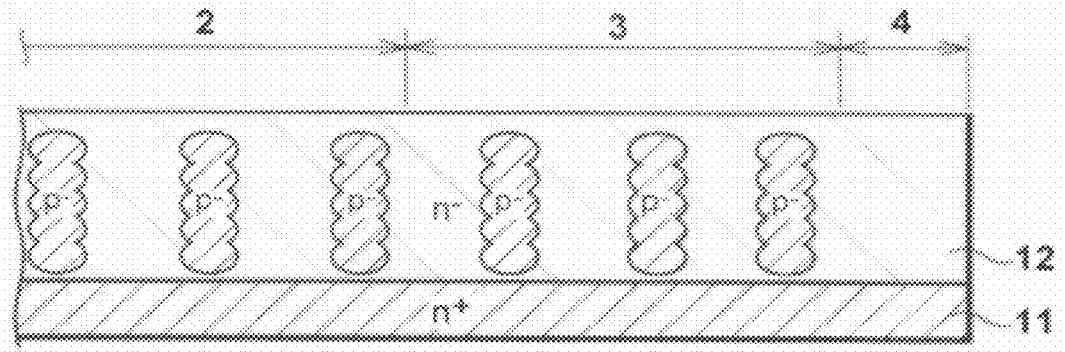
FIG. 7 is a fifth process cross sectional diagram.

Next, a heating process is performed and as shown in FIG. 7, p type impurities of each p type impurity region 37a to 37f are diffused, and the p type columnar regions 13 and 23n are formed in the n⁻ type drift region 12. Here, because all the p type impurity regions 37a to 37f are formed in the same way as stated above, each of the p type columnar regions 13, 23n are formed with the same depth, width (planar area) and amount of impurities in either the cell region 2 or the periphery region 3. In addition, the distance (pitch) D between the p type columnar region 13 and an adjacent p type columnar region 13 in the cell region 2 is the same as the distance (pitch) D between the p type columnar region 23n and an adjacent p type columnar region 23n in the periphery region 3.

Figure 8:
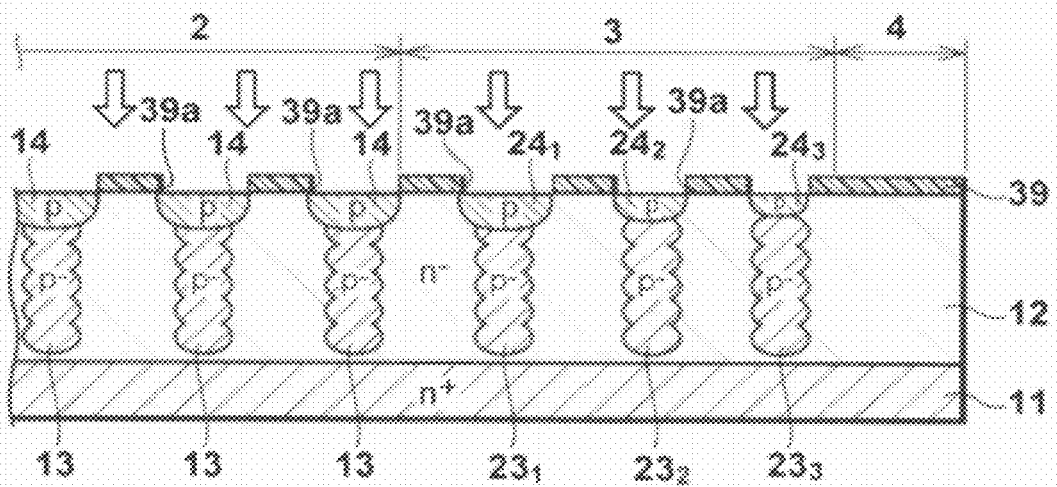
FIG. 8 is a sixth process cross sectional diagram.

Next, as is shown in FIG. 8, a resist film 39 formed with an aperture part 39a including a desired pattern is formed on the surface of the n⁻ type drift region 12. Here, the distance (pitch) between one aperture part 39a and an adjacent aperture part 39a is equal regardless of the cell region 2 and the periphery region 3. On the other hand, the width of the aperture part 39a formed in the periphery region 3 becomes gradually smaller from the interior side approaching the exterior side. In this way, the interval between aperture parts 39a formed in the periphery region 3 becomes gradually larger approaching the exterior side. Furthermore, the width of all the aperture parts formed in the cell region 2 is equal.

Using this resist pattern 39, p type impurities are implanted into the upper surface part of the n⁻ type region 12 using an ion implantation method. Following this, the implanted p type impurities are diffused and as is shown in FIG. 8 the p type base region 14 and the p type electrical field buffer region 24n are formed. Here, of course, the p type base region 14 and the p type electrical field buffer region 24n are formed in a shape of the aperture part 39a of the resist film 39, that is, a shape corresponding to the width of the aperture part 39a. Specifically, in the cell region 2, all of the p type base regions 14 are formed to the same width. In addition, the distance D between one p type base region 14 and an adjacent p type base region 14 are all equal.

On the other hand, in the periphery region 3, the width Wn of the p type electrical field buffer region 24n becomes gradually smaller from the interior side approaching the exterior side. As a result, the distance D between one p type electrical field buffer region 24n and an adjacent p type electrical field buffer region 21n all become equal. However, the interval Sn between one p type electrical field buffer region 24n and an adjacent p type electrical field buffer region $24n_{+1}$ becomes gradually larger from the interior side approaching the exterior side.

Following this, each structure of the upper layer of the semiconductor substrate 7 and the drain electrode 19 is formed using a known process such as a vapor deposition method, a photolithography method, etching method or lift off method. In this way, the semiconductor device 1 related to the present embodiment shown in FIG. 1 is complete.

[Effects of the Semiconductor Device]

The effects of the semiconductor device 1 related to the present embodiment stated above are as follows.

As stated above, the semiconductor device 1 related to the present embodiment is formed so that the width Wn of the electrical field buffer region 24n in the periphery region 3 becomes gradually smaller from the interior side approaching the exterior side. In this way, in the case where a reverse direction/bias voltage is applied, the depletion layer widens as far as the exterior side of the outermost p⁻ type columnar region $23_3$ of the periphery region 3 and the thickness of the depletion layer becomes gradually and smoothly smaller from the interior side of the periphery region 3 approaching the exterior side. Therefore, in the semiconductor device 1, because an electrical field can be buffered and an electrical field concentration can be reduced, even if a reverse bias is applied it is possible to reduce a leak current in the cell region 2 and the periphery region 3. As a result, it is possible to improve the resistance of the semiconductor device 1.

In addition, in the semiconductor device 1 related to the present embodiment, because it is possible to improve resistance by making the width Wn of the electrical field buffer region 24n gradually smaller from the interior side approaching the exterior side, it is possible to make the distance D between an electrical field buffer region 24n and an adjacent electrical field buffer region $24n_{+1}$ equal. At the same time, it is possible to make the distance D between a p⁻ type columnar region 13 and an adjacent p⁻ type columnar region 13, and the distance D between a p⁻ type columnar region 23n and an adjacent p⁻ type columnar region 23n equal. In this way, it is possible to make the depth and width (planar area) of all the p⁻ type columnar regions 13 equal regardless to the cell region 2 and the periphery region 3. In addition, it is possible to simultaneously form the p⁻ type columnar regions 13 and 23n using the same amount of ion implantation, and it is possible to easily make the amount of p type impurities of all the p⁻ type columnar regions 13 and 23n equal. As a result, the charge ratio between an drift region 12 and a p⁻ type columnar region 13 in the cell region 13 and the charge ratio between an n⁻ type drift region 12 and a p⁻ type columnar region 23n in the periphery region 3 is made equal and it is possible to improve the resistance of the semiconductor device 1. That is, in the semiconductor region 1, it is possible to simplify the manufacturing process and also improve resistance.

In addition, in the semiconductor device 1 related to the present embodiment, the electrical field buffer region 24n is formed gradually shallower from the interior side approaching the exterior side. In this way, because the thickness of the depletion layer becomes smaller more smoothly, it is possible to improve the electrical field buffer. As a result, it is possible to further improve the resistance of the semiconductor device 1.

[Actual Results of a Potential Distribution Simulation]

Next, the actual results of a potential distribution simulation for demonstrating the results described above are as follows.

A potential distribution simulation was carried out for an example corresponding to the semiconductor device 1 related to the present invention and a first comparative example and a second example for comparison.

In the example, the semiconductor device 1 with an increased number of p type columnar regions 23n and electrical buffer regions 24n in the periphery region 3 was sampled. Furthermore, the sample (the semiconductor device 1) related to the test is a semiconductor device having a resistance of 800 V.

In the first comparative example, all the electrical field buffer regions 24n were formed to the approximately the same size as the largest electrical field buffer region 24n of the example. Furthermore, the number of p type columnar regions and electrical field buffer regions in the periphery region in the first comparative example is the same umber as in the example.

In the second comparative example, all the electrical field buffer regions 24n were formed to the approximately the same size as the smallest electrical field buffer region 24n of the example. That is, the width of the p type columnar region 23n and the width of the electrical field buffer region 24n is approximately the same. Furthermore, the number of p type columnar regions and electrical field buffer region in the periphery region 3 of the second comparative example is the same as in the example.

Figure 9:
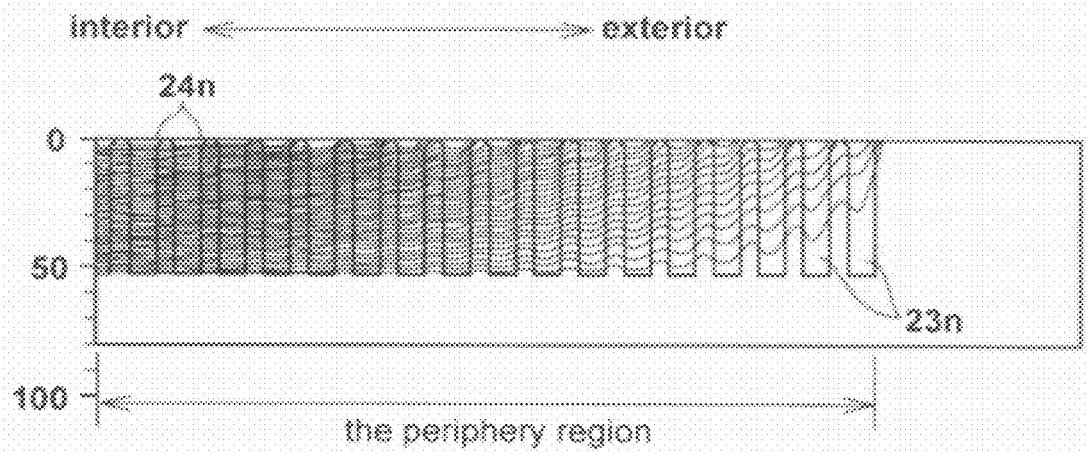
FIG. 9 are the voltage distribution simulation results related to an embodiment.
Figure 10:
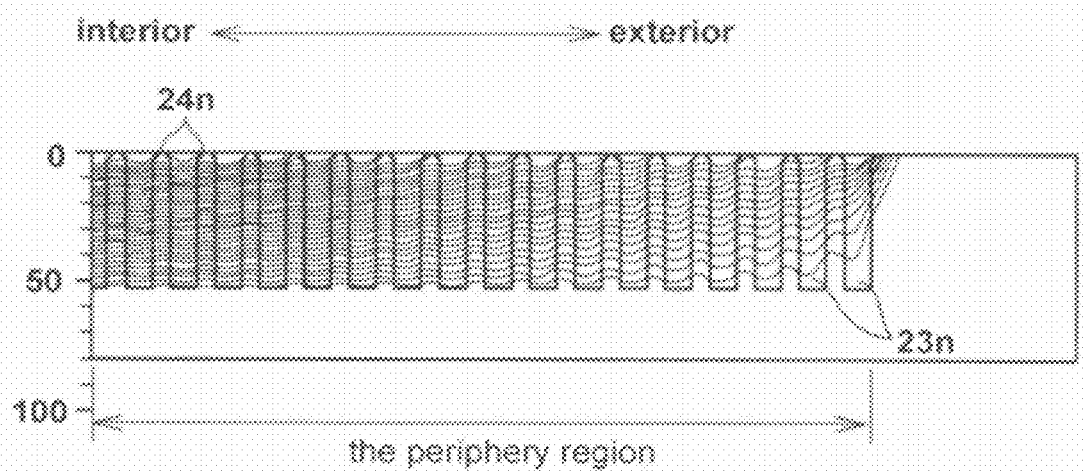
FIG. 10 are the voltage distribution simulation results related to a first comparative example.
Figure 11:
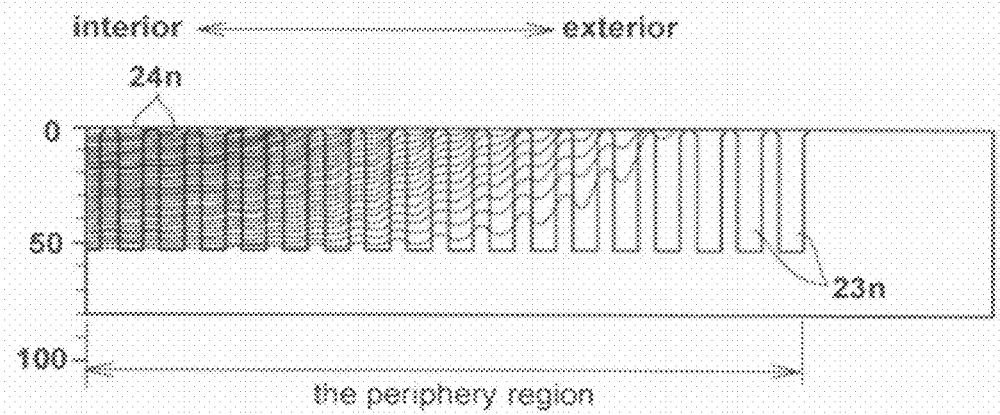
FIG. 11 are the voltage distribution simulation results related to a second comparative example.
Figure 12:
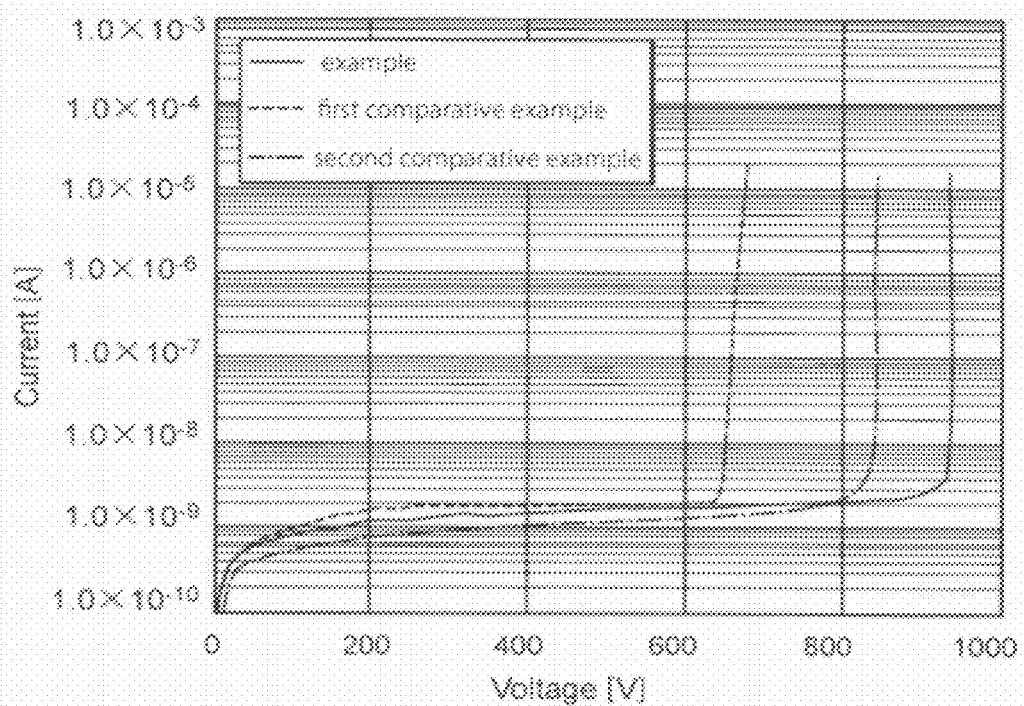
FIG. 12 is a graph which shows the relationship between a reverse bias voltage and a leak current in the semiconductor device related to the present embodiment and a semiconductor device related to the first comparative example and the second comparative example.

The results of the potential distribution simulation in the example, the first comparative example and the second comparative example are each shown in FIG. 9, FIG. 10 and FIG. 11. FIG. 12 is a graph showing the relationship between a reverse bias voltage and a leak current in the example, first comparative example and second comparative example. Furthermore, the wave-line in FIG. 9 to FIG. 11 shows an equipotential line. FIG. 9 to FIG. 11 shows the p type columnar region 23n and the electrical field buffer region 24n of the periphery region 3.

As is shown in FIG. 9, in the present example, the equipotential line extends further to the exterior side than the outermost p type columnar region 23n and electrical field buffer region 24n. In addition, in the outermost exterior side the interval of the equipotential line is wider compared to the comparative example and the electrical field concentration is buffered. In addition, in this way, in the outermost exterior side, the thickness of the depletion layer becomes smoothly smaller. As a result, as is shown in FIG. 12, in the present example, it is possible to improve resistance of the semiconductor device 1 compared to the first comparative example and the second comparative example.

On the other hand, as is shown in FIG. 10, the first comparative example, the equipotential line extends further to the exterior side than the outermost p type columnar region 23n and electrical field buffer region 24n. However, in the outermost exterior side, the interval of the equipotential line is small and an electrical field is concentrated. As a result, in the first comparative example, a leak current flows easily in the outermost exterior region and as is shown in FIG. 12, the resistance becomes lower compared to the example.

In addition, as is shown in FIG. 11, in the second comparative example the equipotential line does not extend to the outermost p type columnar region 23n and electrical field buffer region 24n. In this way, in the second comparative example, a leak current flows in the vicinity of the cell region 2 and as is shown in FIG. 12 resistance becomes lower compared to the example.

In this way, it is possible to improve resistance in the semiconductor device 1 related to the example compared to the first comparative example and the second comparative example.

(Other Embodiments)

While the invention herein is disclosed by means of specific embodiments and applications thereof, numerous modifications and variations could be made thereto without departing from the scope of the invention set forth in the claims. Below, a transformation example in which one part of the above stated example is transformed is explained.

For example, it is possible to appropriately change the shape, number and material of each structure in embodiment described above.

In the embodiment described above, a structure in which three p⁻ type columnar regions and electrical field buffer regions in the periphery region are arranged was described. However, the number of electrical field buffer regions can be appropriately changed.

In the embodiment described above, the width of the electrical field buffer region becomes gradually smaller from the interior side approaching the exterior side. However, it is possible to change the method of changing this width. For example, the width of the innermost electrical field buffer region and the outermost electrical field buffer region may be set different and a region in which the width of the electrical field buffer region may be set between the innermost side and outermost side. In other words, the interval of the innermost side electrical field buffer region and the interval of the outermost side electrical field buffer region may be different and a region in which an interval between electrical field buffer regions is equal may be set somewhere in between.

In the embodiment described above, the depth of the electrical field buffer region becomes gradually shallower from the interior approaching the exterior. However, it is possible to change the method of changing this depth. For example, all the depths of the electrical field buffer regions may be set equal. In addition, a region in which the depth of the electrical field buffer regions is equal may be somewhere in between the innermost side and outermost side. Furthermore, the depth of the electrical field buffer region may be set deeper than a base region.

In the embodiment described above, a stack type structure in which the p⁻ type columnar region is formed by stacking a plurality of drift region layers was explained. However, after forming a trench in a drift region it is possible to apply the present invention to a trench type structure formed by burying a p type columnar region within this trench. In this case it is possible to obtain the same effects as in the embodiment described above.

In the embodiment described above, the electrical field buffer region is formed in a dot shape seen from a planar view. However, it is possible to apply the present invention to a semiconductor device arranged with ring shaped electrical field buffer region so as to enclose the cell region. Furthermore, in the case where the electrical field buffer region is formed in a ring shape, it is preferred to form the p type columnar region in a dot shape see from a planar view in the cell region and periphery region.

The p type and n type are examples in the embodiment described above and these conduction types can be reversed.

What is claimed is:

1. A semiconductor device comprising:
   a cell region formed with semiconductor elements;
   a periphery region formed on a periphery of the cell region;
   a first conduction type region of a first conductive type formed in the cell region and the periphery region;
   a plurality of first columnar regions of a second conductive type formed in the first conduction type region of the cell region;
   a plurality of second columnar regions of the second conductive type formed in the first conduction type region of the periphery region; and
   a plurality of electrical field buffer regions of the second conductive type formed on an upper part of each of the second columnar regions,
   wherein an interval between one of the electrical field buffer regions and an adjacent of one electrical field buffer regions is different between an interior side and an exterior side of the periphery region, and a distance between centers of one of the first columnar regions and an adjacent one of the first columnar regions, a distance between centers of one of the second columnar regions and an adjacent one of the second columnar regions, and a width of the first and the second columnar regions are equal.

2. The semiconductor device according to claim 1, wherein the interval between the one of the electrical field buffer regions and the adjacent one of the electrical field buffer regions on the interior side of the periphery region is smaller than the interval between the one of the electrical field buffer regions and the adjacent one of the electrical field buffer regions on the exterior side of the periphery region.

3. The semiconductor device according to claim 2, wherein the interval between the one of the electrical field buffer regions and the adjacent one of the electrical field buffer regions becomes gradually larger from the interior side of the periphery region approaching the exterior side.

4. The semiconductor device according to claim 3, wherein a width of the electrical field buffer regions becomes gradually smaller from the interior side of the periphery region approaching the exterior side.

5. The semiconductor device according to claim 3, wherein a depth of the electrical field buffer regions becomes gradually shallower approaching the exterior side of the periphery region.

6. The semiconductor device according to claim 2, wherein a width of the electrical field buffer regions becomes gradually smaller from the interior side of the periphery region approaching the exterior side.

7. The semiconductor device according to claim 6, wherein a depth of the electrical field buffer regions becomes gradually shallower approaching the exterior side of the periphery region.

8. The semiconductor device according to claim 2, wherein a depth of the electrical field buffer regions becomes gradually shallower approaching the exterior side of the periphery region.

* * * * *